(12) United States Patent
Schulze et al.

(10) Patent No.: US 8,587,025 B1
(45) Date of Patent: Nov. 19, 2013

(54) METHOD FOR FORMING LATERALLY VARYING DOPING CONCENTRATIONS AND A SEMICONDUCTOR DEVICE

(75) Inventors: Hans-Joachim Schulze, Taufkirchen (DE); Franz-Josef Niedernostheide, Muenster (DE); Yvonne Gawlina, Pullach im Isartal (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/540,693

(22) Filed: Jul. 3, 2012

(51) Int. Cl.
*H01L 29/66* (2006.01)

(52) U.S. Cl.
USPC ........... 257/139; 438/458; 438/402; 438/405; 438/420; 438/516; 257/E21.317; 257/E21.32; 257/E21.561

(58) Field of Classification Search
USPC .......... 438/458, 402, 405, 420, 516; 257/139, 257/E21.317, E21.32, E21.561
See application file for complete search history.

(56) References Cited

U.S. PATENT DOCUMENTS

| | | | |
|---|---|---|---|
| 8,003,491 B2* | 8/2011 | Cherekdjian et al. | 438/458 |
| 2006/0073684 A1* | 4/2006 | Schulze et al. | 438/514 |
| 2007/0117354 A1* | 5/2007 | Gadkaree et al. | 438/478 |
| 2010/0112785 A1* | 5/2010 | Cherekdjian et al. | 438/460 |
| 2010/0112825 A1* | 5/2010 | Cherekdjian et al. | 438/798 |
| 2010/0221927 A1* | 9/2010 | Cherekdjian et al. | 438/795 |
| 2012/0028443 A1* | 2/2012 | Cherekdjian et al. | 438/460 |
| 2013/0065345 A1* | 3/2013 | Huang | 438/57 |

FOREIGN PATENT DOCUMENTS

DE 102005041335 B4 5/2007

* cited by examiner

*Primary Examiner* — Michael Jung
*Assistant Examiner* — Ankush Singal
(74) *Attorney, Agent, or Firm* — Murphy, Bilak & Homiller, PLLC

(57) ABSTRACT

A method for forming a laterally varying n-type doping concentration is provided. The method includes providing a semiconductor wafer with a first surface, a second surface arranged opposite to the first surface and a first n-type semiconductor layer having a first maximum doping concentration, implanting protons of a first maximum energy into the first n-type semiconductor layer, and locally treating the second surface with a masked hydrogen plasma. Further, a semiconductor device is provided.

19 Claims, 5 Drawing Sheets

METHOD FOR FORMING LATERALLY VARYING DOPING CONCENTRATIONS AND A SEMICONDUCTOR DEVICE

TECHNICAL FIELD

Embodiments of the present invention relate to methods for forming laterally varying n-type doping concentrations in a semiconductor body and to related semiconductor devices, in particular to power semiconductor devices having a semiconductor body with a structured field-stop region.

BACKGROUND

Semiconductor devices such as diodes and transistors, for example field-effect controlled switching devices such as a Metal Oxide Semiconductor Field-effect Transistor (MOSFET) or an Insulated Gate Bipolar Transistor (IGBT) have been used for various applications including but not limited to use as switches in power supplies and power converters, electric cars, air-conditioners, and even stereo systems. Particularly with regard to power devices capable of switching large currents and/or operating at higher voltages, low on-state resistance, which is in the following also referred to as on-resistance $R_{on}$, soft switching behavior and high voltage blocking capability are often desired.

Edge-termination structures such as field plates and/or floating guard rings are often used in a peripheral area surrounding an active area for switching and/or controlling a load current to redistribute the electric field such that the electric field close to a semiconductor surface is reduced. Accordingly, blocking capability of the semiconductor device is improved.

In addition, higher doped field-stop regions may be used in power semiconductor devices to improve softness during switching-off and/or commutating the semiconductor device. Field-stop regions may be formed only in parts of the semiconductor device. Such field-stop regions could be formed by masked implantation, for example by proton implantation, and subsequent drive-in. For a typical power semiconductor device, the penetration depth of the field-stop region may, for example, be about 30 μm to about 60 μm. However, masking protons with high enough energy to penetrate deep enough into the semiconductor material typically poses significant challenges, in particular in thin-wafer technology. Using of apertures such as stencil masks is not compatible with thin-wafer technology. Forming thick masks on the wafer backside may cause significant wafer bowing. This may have an impact on the manufacturing. Thinner implantation masks may be used for other n-type dopants such as selenium or phosphorus. However, the related drive-in processes are accompanied by higher temperature loads which limits the use in thin-wafer technology.

SUMMARY

According to an embodiment of a method for forming a laterally varying n-type doping concentration, the method includes providing a semiconductor wafer having a first surface, a second surface arranged opposite to the first surface, and a first n-type semiconductor layer with a first maximum doping concentration; forming in the first n-type semiconductor layer a second n-type semiconductor layer having a maximum doping concentration which is higher than the first maximum doping concentration, wherein forming the second n-type semiconductor layer includes implanting protons of a first maximum energy into the first n-type semiconductor layer; and locally treating the second surface with a masked hydrogen plasma.

According to an embodiment of a method for forming a bipolar semiconductor device, the method includes: providing a semiconductor wafer including a first surface having a normal direction defining a vertical direction, and a first n-type semiconductor layer arranged below the first surface; forming a p-type semiconductor layer which forms a pn-junction with the first n-type semiconductor layer; implanting protons into the first n-type semiconductor layer; and locally treating a second surface of the semiconductor wafer with a masked hydrogen plasma.

According to an embodiment of a semiconductor device, the semiconductor device includes: a semiconductor body with a first surface having a normal direction defining a vertical direction; a first n-type semiconductor region arranged below the first surface and having a first maximum doping concentration; and a second n-type semiconductor region arranged below the first n-type semiconductor region. In a vertical cross-section, the second n-type semiconductor region includes two spaced apart first n-type portions and a second n-type portion, each of which adjoins the first n-type semiconductor region. The two spaced apart first n-type portions have a maximum doping concentration which is higher than the first maximum doping concentration and a first minimum distance to the first surface. The second n-type portion has a maximum doping concentration which is higher than the first maximum doping concentration and a second minimum distance to the first surface which is larger than the first minimum distance. The semiconductor device further includes a p-type second semiconductor layer which forms a pn-junction with the second n-type portion.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1A:
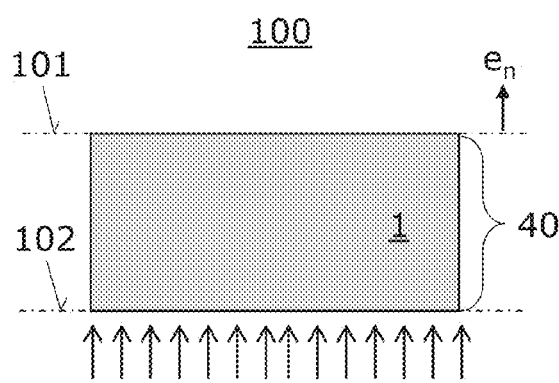
FIGS. 1A to 1D illustrate vertical cross-sections through a semiconductor body during method steps of a method according to embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

Specific embodiments described in this specification pertain to, without being limited thereto, to semiconductor devices with a field-stop layer, in particular bipolar semiconductor devices with a field-stop layer and manufacturing methods therefor. Within this specification the terms "semiconductor device" and "semiconductor component" are used synonymously. The formed semiconductor device is typically a vertical semiconductor device such as a vertical diode, a vertical thyristor or a vertical IGBT or a MOSFET with a first load electrode arranged on the first surface and a second load electrode arranged on the second surface. The first and second load electrodes may be formed as respective metallizations. Typically, the formed semiconductor device is a power semiconductor device having an active area with a plurality of cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range and higher. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in low resistive electric contact with a drain or collector electrode. The source region or emitter region is in low resistive electric contact with a source or emitter electrode. In the context of the present specification, the term "in low resistive electric contact" intends to describe that there is a low-ohmic ohmic current path between respective elements or portions of a semiconductor device when no voltages are applied to and/or across the semiconductor device. Within this specification the terms "in low resistive electric contact", "electrically coupled", and "in low resistive electric connection" are used synonymously.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and insulated from the body region and configured to form and/or control a channel region through the body region.

In the context of the present specification, the terms "field electrode" and "field plate" intend to describe an electrode which is arranged next to a semiconductor region, typically the drift region, insulated from the semiconductor region, and configured to expand a depleted portion in the semiconductor region by applying an appropriate voltage, typically a positive voltage for an n-type semiconductor region.

In the context of the present specification, the term "mesa" or "mesa region" intends to describe a semiconductor region between two adjacent trenches extending into the semiconductor substrate or body in a vertical cross-section.

The term "commutating" as used in this specification intends to describe the switching of the current of a semiconductor device from the forward direction or conducting direction in which a pn-load junction, for example the pn-junction between the body region and the drift region of an IGBT or MOSFET, is forwardly biased to the opposite direction or reverse direction in which the pn-load junction is reversely biased.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. For power semiconductor applications currently mainly Si, SiC (silicon carbide), GaAs (silicon arsenide) and GaN (gallium nitride) materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance $R_{on}$. The manufacturing methods explained herein typically refer to Si-semiconductor devices and SiC-semiconductor devices.

FIGS. 1A to 1D illustrate vertical cross-sections through a semiconductor body 40 during method steps of a method for manufacturing a semiconductor device 100. In a first process, a semiconductor body 40, for example a wafer or substrate, having a first surface 101 and a second or backside surface 102 opposite the first surface 101 is provided. The normal direction $e_n$ of the first surface 101 is substantially parallel to the vertical direction. The vertical thickness of the wafer and semiconductor body 40, respectively, is typically lower than about 200 µm or even lower than about 100 µm, but may also be up to about 1.5 mm.

As illustrated in FIG. 1A, the semiconductor body 40 typically includes a first n-type semiconductor layer 1 having a first maximum doping concentration. In the exemplary embodiment, the first n-type semiconductor layer 1 extends between the first surface 101 and the second surface 102.

Thereafter, a second n-type semiconductor layer 2 having a maximum doping concentration which is higher than the first maximum doping concentration is formed in the first n-type semiconductor layer 1. The process of forming the second n-type semiconductor layer 2 includes implanting of protons into the first n-type semiconductor layer 1. As indicated by the arrows in FIG. 1A, the protons are typically implanted through the second surface 102.

In a subsequent annealing process, so-called hydrogen-induced or proton-induced donors are formed in the second n-type semiconductor layer 2 which increase the effective n-type doping concentration. The annealing is typically performed for about 15 min to about 300 min at temperatures of about 250° C. to about 500° C. or preferentially of about 350° C. to 420° C. This results only in a low temperature budget so that further structures formed in the remaining upper portion of the first n-type semiconductor layer 1 and/or on the first surface are typically not affected.

Figure 1B:
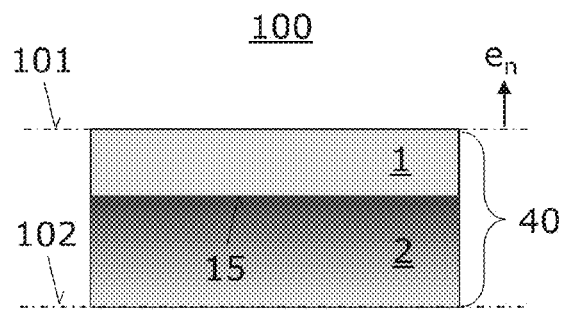

The protons are typically mask-less implanted. This results in a substantially horizontally orientated interface 15 between the first n-type semiconductor layer 1 and the second n-type semiconductor layer 2 as is illustrated in FIG. 1B.

The distance of the interface 15 from the second surface 102 depends on the penetration depth and kinetic energy, respectively, of the implanted protons. Typically, the protons are implanted with energies of more than about 500 keV or even more than about 700 keV. The penetration depth of the implanted protons may be up to about 10 µm, up to about 30 µm or up to about even 60 µm. For semiconductor bodies 40 with a larger vertical extension of, for example, more than about 100 µm, the penetration depth of the implanted protons may be even larger.

Furthermore, the process of implanting protons may include several steps, for example 4 or 6 steps, of implanting protons of different energies. Accordingly, a vertical doping profile of the second n-type semiconductor layer 2 may be provided. This may improve the softness of the semiconductor device to be manufactured.

Figure 1C:
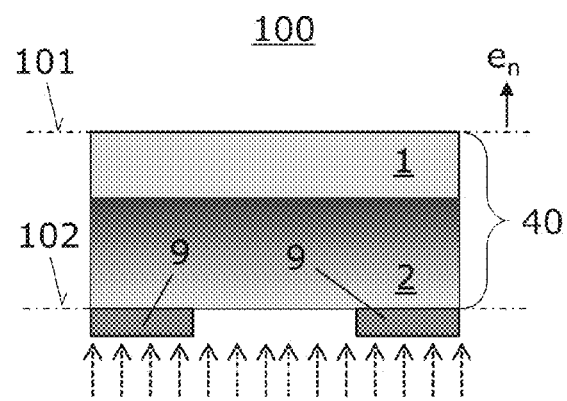

Referring to FIG. 1C, a structured mask 9 is formed on the second surface 102. This typically includes forming a mask layer 9 on the second surface 102 and recessing the mask layer 9 to partly expose the semiconductor body 40 at the second surface 102.

As explained above, semiconductor devices are typically manufactured on wafer-level. Accordingly, FIGS. 1A to 1D as well as FIGS. 4A to 4F explained below typically correspond to a section of a cross-section through a respective wafer. Typically, the illustrated semiconductor body 40 in FIGS. 1A to 1D corresponds to one of a plurality of semiconductor devices 100 manufactured in parallel. The illustrated semiconductor body 40 may, for example, correspond to a portion of one of the plurality of semiconductor devices 100, for example to a unit cell of an active area of a power semiconductor device 100. Depending on the semiconductor device 100 to be manufactured, the mask layer 9 may be recessed in an active area and/or a peripheral area which typically surrounds the active area of the semiconductor device 100. In these embodiments, a plurality of openings is formed in mask layer 9 to expose corresponding portions of the second n-type semiconductor layer 2 at the second surface 102.

The formed mask 9 is adapted to protect the covered portions of the second n-type semiconductor layer 2 against a subsequent hydrogen plasma treatment. Accordingly, the vertical thickness of mask 9 and mask layer 9, respectively, may be comparatively small, typically less than about 1 µm. This allows reducing of wafer-bowing and thus facilitates processing of thin wafers with vertical extension below 200 µm or even below 100 µm.

Mask 9 may be formed as an insulator mask, for example a silicon oxide mask or a silicon nitride mask, a hard mask or a metal mask. Forming mask 9 may include thermal oxidation of the second n-type semiconductor layer 2 at the second surface 102 and/or depositing suitable material on the second surface 102 to form mask layer 9, and an etching process through a photolithographically structured mask.

Figure 1D:
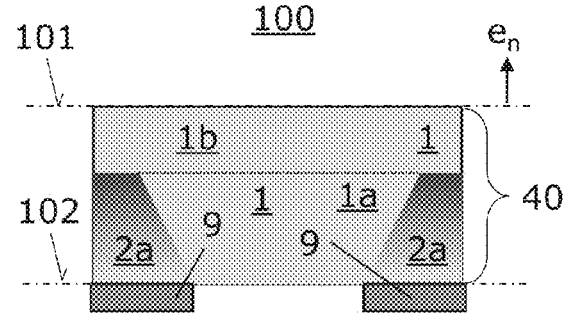

Thereafter, the second surface 102 is locally treated with a hydrogen plasma through mask 9 as indicated by the dashed arrows in FIG. 10. Accordingly, the n-type impurities formed by proton implantation and annealing are locally at least partly inactivated and/or dissociated in the second n-type semiconductor layer 2. This is explained in more detail below with regard to FIGS. 2 and 3. The resulting semiconductor structure 100 is illustrated in FIG. 1D. Thereafter mask 9 may be removed from the second surface 102.

Accordingly, the second n-type semiconductor layer 2 is laterally, i.e. in a horizontal direction, structured by locally reducing the effective n-type doping. Typically, the additional active n-type donors formed by proton implantation and annealing are locally compensated by hydrogen plasma treating. This is illustrated by the horizontal dotted line in FIG. 1D which extends between the remaining step-shaped second n-type semiconductor regions 2a having a higher doping concentration than the first n-type semiconductor layer 1 at least in an upper portion arranged above the second n-type semiconductor regions 2a and the dotted line, respectively. In a lower portion 1a of the first n-type semiconductor layer 1 arranged vertically below the dotted line and horizontally between the second n-type semiconductor regions 2a, the effective maximum n-type doping concentration may substantially correspond to the maximum n-type doping concentration of this portion prior to implanting protons. In the following, the second n-type semiconductor regions 2a are also referred to as n-type semiconductor portions 2a and deep field-stop portions 2a.

The lower portion 1a and an upper portion 1b of the first n-type semiconductor layer 1 may form a contiguous first n-type semiconductor region. In another embodiment, the lower portion 1a has a maximum doping concentration which is higher than a maximum doping concentration of the upper portion 1b of the first n-type semiconductor layer 1. In this embodiment, the maximum doping concentration of the lower portion 1a is typically lower than a maximum doping concentration of the second n-type semiconductor regions 2a.

The lower portion 1a may also have a maximum doping concentration which substantially matches the maximum doping concentration of the second n-type semiconductor regions 2a. In this embodiment, a sub-portion of lower portion 1a close to the transition between the regions 1a and 1b has typically a lower doping concentration. For example, the effective n-type doping concentration of the sub-portion may be substantially compensated in the device to be manufactured.

Close to the second surface 102 or even close to the dotted line, the additional active n-type donors formed by proton implantation and annealing may be fully compensated or even be over-compensated. In this case, a further process of implanting protons of lower energy and penetration depth, respectively, followed by a further anneal process may be used to increase the effective n-type doping close to the second surface. This may also be used to form a contiguous field-stop layer which includes the second n-type semiconductor regions 2a. Furthermore, the leakage current in the semiconductor device to be manufactured may significantly be reduced.

The method explained above with regard to FIG. 1A to 1D may be used to form a laterally varying doping concentration profile in an n-type semiconductor layer, for example to form a laterally structured field-stop region or layer. As the used masks may be comparatively thin wafer bowing is at least reduced. Furthermore the temperature budget is also comparatively low. Accordingly, the method is also well suited for thin-wafer technology.

Figure 2:
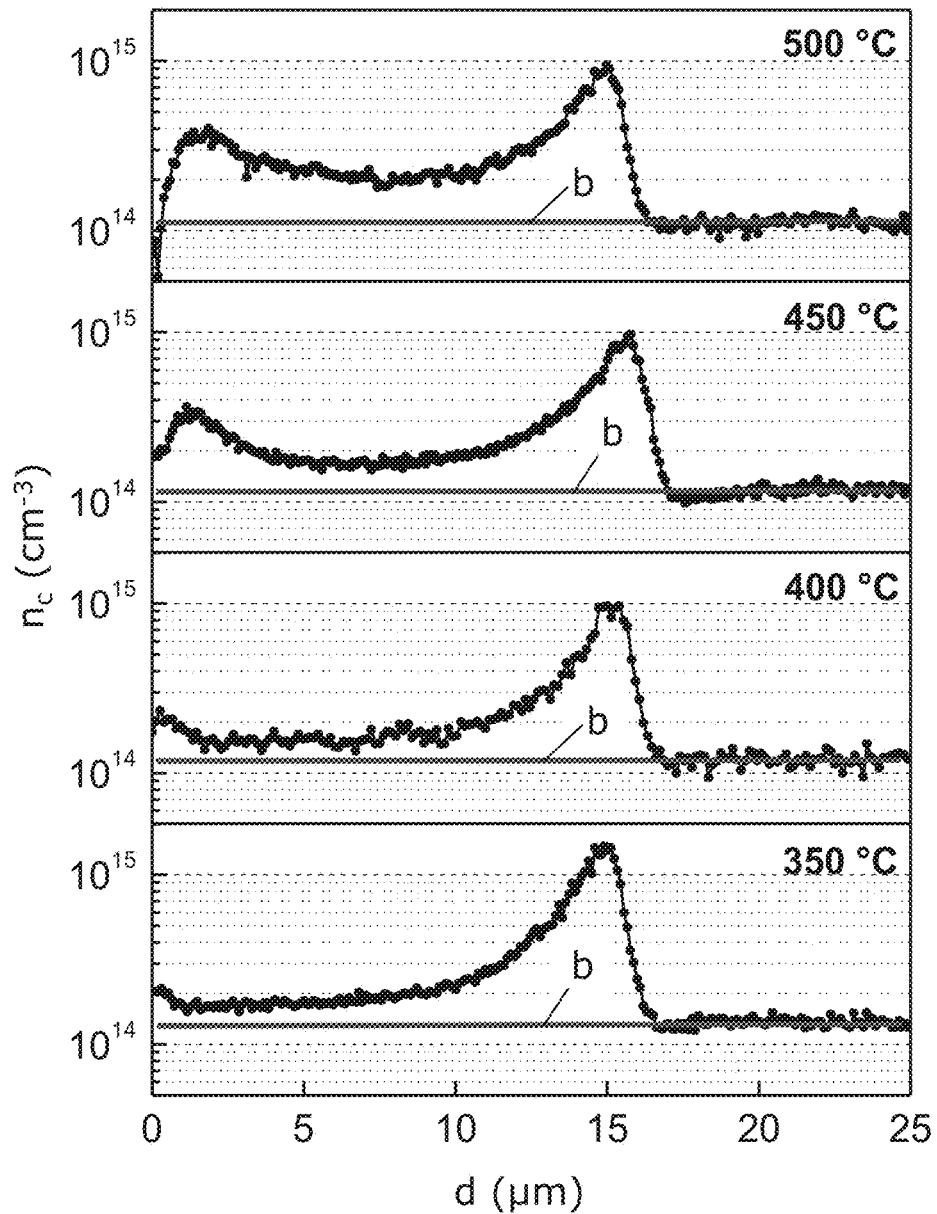
FIG. 2 illustrates doping concentrations in semiconductor bodies according to embodiments.
Figure 3:
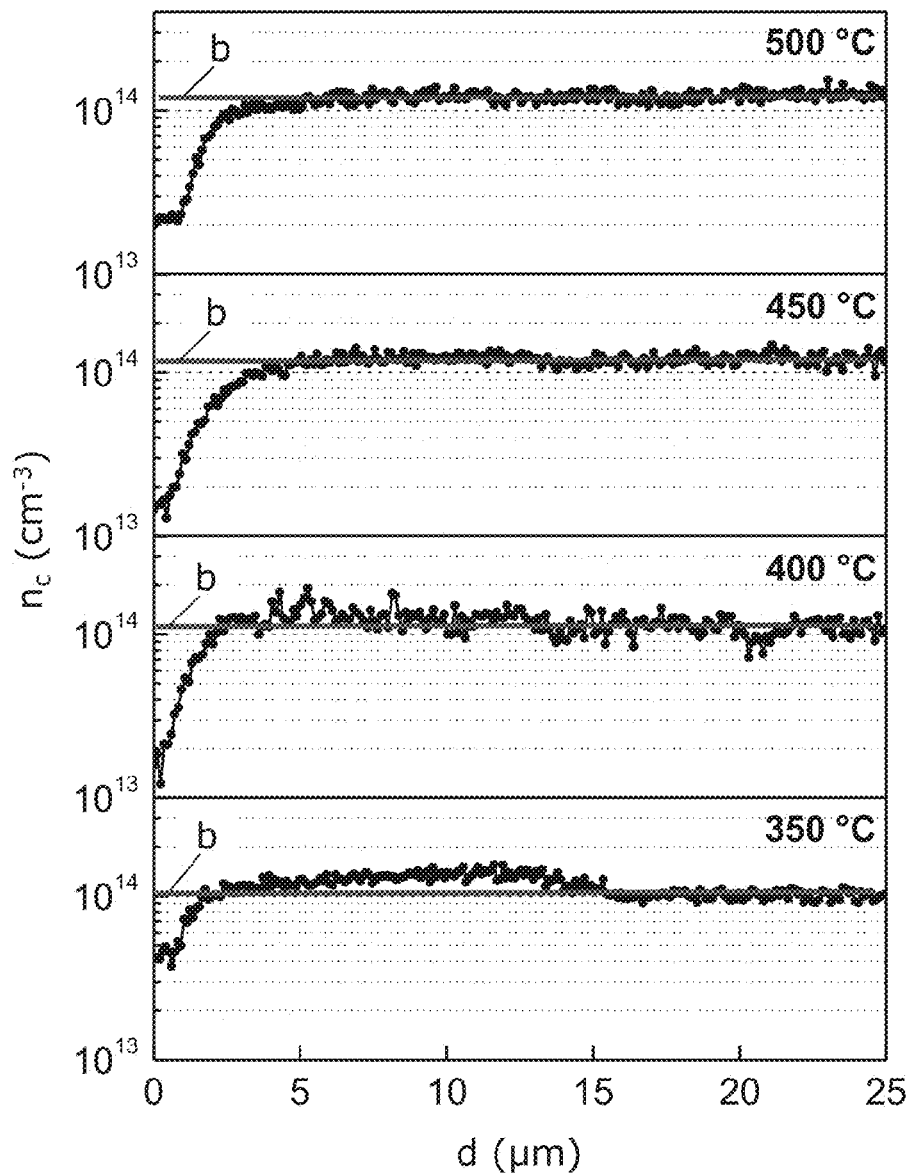
FIG. 3 illustrates doping concentrations in semiconductor bodies according to embodiments.

FIGS. 2 and 3 illustrate effective n-type vertical doping concentrations $n_c$ in semiconductor bodies which are obtained by implanting protons into a first n-type silicon semiconductor layer, annealing and masked hydrogen plasma treating as explained above with regard to FIG. 1A to FIG. 1D for different process parameters. The shown n-type doping concentrations $n_c$ were calculated from spreading resistance measurements and may correspond to the n-type doping concentrations $n_c$ of a path in a lower part of a central vertical line in FIG. 1D where the depth d measures the distance from the second surface 102. The full horizontal lines b in FIGS. 2 and 3 correspond to the background doping prior to implanting protons annealing and masked hydrogen plasma treating. FIGS. 2 and 3 illustrate the effective n-type doping concentrations $n_c$ after hydrogen plasma treating for 15 min (FIG. 2) and 60 min (FIG. 3), respectively, at different plasma temperatures. The hydrogen plasma treatment results, depending on temperature, power and duration, in redistributing and inactivating the electrically active impurities formed by proton implantation and annealing. The electrically active impurities are deactivated by hydrogen plasma treatment. The higher the hydrogen plasma temperature and duration the larger is the effect of reducing the effective n-type doping. Typically, the masked hydrogen plasma is applied for at least 15 min and less than about two hours, more typically less than about 30 min. The plasma temperature may range from about 300° C. to about 600° C.

In the exemplary embodiment, the electrically active impurities formed by proton implantation and annealing are substantially compensated in the bulk at temperatures of above about 350°. In addition, other active donor-type impurities may be deactivated and/or acceptor-like impurities may be activated by hydrogen plasma treating. Accordingly, the effective n-type vertical doping concentrations $n_c$ may drop below the base doping concentration, for example close to the hydrogen plasma treated surface (d=0).

Depending on number and energy of proton implantation processes, anneal conditions and conditions of locally treating the second surface with masked hydrogen plasma, effective n-doping concentrations may be structured in vertical direction and horizontal directions. This allows forming of locally structured field-stop regions using comparatively thin masks.

It goes without saying that this method may also be applied to semiconductor bodies or wafers which already include at least one pn-junction to form a structured field-stop layer, for example close to the at least one pn-junction. Accordingly, the resulting device performance with regard to softness and/or breakdown voltage of a diode, a thyristor, a MOSFET or an IGBT may be improved. Furthermore, the method may be used to form a so-called break-over diode in a semiconductor device by locally structuring the field-stop layer.

Due to the comparatively low temperature load or budget, further structures formed in the remaining upper portion of the first n-type semiconductor layer and/or on the first surface are typically not affected by proton implantation, annealing and the hydrogen plasma. Accordingly, manufacturing is typically facilitated as the wafer may first completely processed from the first surface, which may required higher temperature loads, for example for forming gate oxides next to the first surface.

In further embodiments, the implanting of protons and masked hydrogen plasma treatment may be done from different surfaces of the semiconductor device. For example, the protons may be implanted into the first n-type semiconductor layer from the first surface, and preferably the first surface is locally treated with masked hydrogen plasma. This approach may facilitate forming of break-over diodes and/or locally increase the effective n-type doping in a drift region of a semiconductor device.

FIGS. 4A to 4D illustrate vertical cross-sections through a semiconductor body 40 during method steps of a method for manufacturing a bipolar semiconductor device 200. Similar as explained above with regard to FIG. 1A, a semiconductor body or semiconductor wafer 40, for example a thin-wafer, is provided in a first process. The wafer 40 has first surface 101 with a normal direction $e_n$ defining a vertical direction and an n-type semiconductor layer 1 arranged below the first surface 101.

Figure 4A:
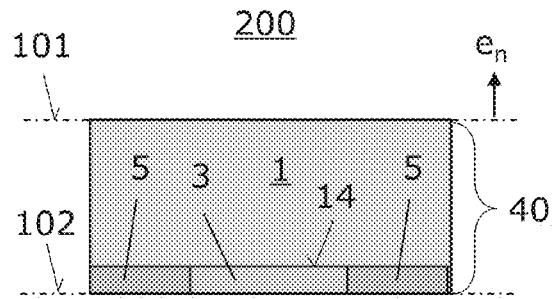
FIGS. 4A to 4E illustrate vertical cross-sections through a semiconductor body during method steps of a method according to further embodiments.

Thereafter, a p-type semiconductor layer 3, 5 which forms a pn-junction 14 with the n-type semiconductor layer 1 and extends to a second surface 102 of the semiconductor wafer 40 is typically formed. The second surface 102 is arranged opposite to the first surface 101. The resulting semiconductor structure is illustrated in FIG. 4A which typically corresponds only to a section through the semiconductor wafer, for example to a unit cell of an active area of one of a plurality of semiconductor device 200 to be manufactured in parallel. Alternatively, the wafer 40 may be provided with the p-type semiconductor layer 3, 5.

According to an embodiment, the p-type semiconductor layer 3, 5 is formed such that it includes, in the vertical cross-section, a first p-type semiconductor region 3 having a second maximum doping concentration and two second p-type semiconductor regions 5 each having a maximum doping concentration which is higher than the second maximum doping concentration, and that the first p-type semiconductor region 3 is, in the vertical cross-section, arranged between the two second p-type semiconductor regions 5. Accordingly, the p-type semiconductor layer 3, 5 of semiconductor device 200 is formed as a locally enhanced backside emitter structure. Forming the p-type semiconductor layer 3, 5 may include epitaxial depositing and/or masked implantation of p-type dopants and subsequent thermal drive-in or activating of the impurity levels by rapid laser thermal annealing.

In another embodiment, the p-type semiconductor layer 3, 5 is formed such that it includes, in the vertical cross-section, a first p-type semiconductor region 3 having a second maximum doping concentration and two second p-type semiconductor regions 5 each having a maximum doping concentration which is lower than the second maximum doping concentration, and that the first p-type semiconductor region 3 is, in the vertical cross-section, arranged between the two second p-type semiconductor regions 5. Accordingly, a current gain factor of a later formed pnp-transistor-structure may be reduced and thus the thermal short-circuit strength improved.

Figure 4B:
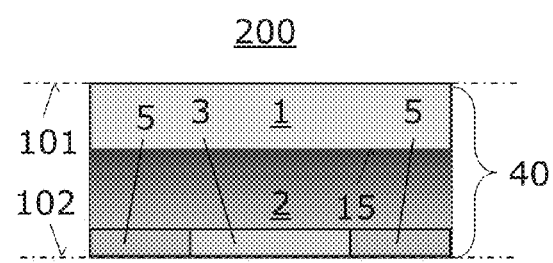

Thereafter, protons are implanted into the n-type semiconductor layer 1, typically from the second surface 102. The resulting semiconductor structure 200 is illustrated in FIG. 4B after annealing. Implanting of protons and annealing is typically performed as explained above with regard to FIGS. 1A and 1B to form an embedded second n-type semiconductor layer 2 having a higher maximum doping concentration than a remaining upper portion of the first n-type semiconductor layer 1.

Figure 4C:
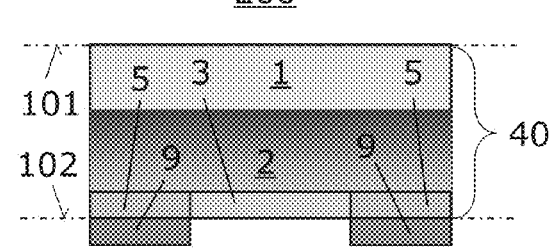
Figure 4D:
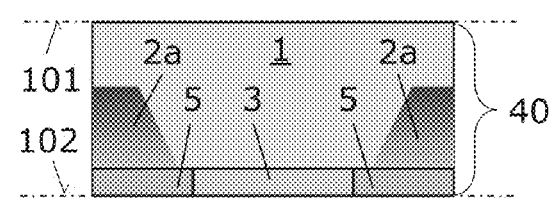

Thereafter, a mask 9 is formed on the second surface 102. The resulting semiconductor structure 200 is illustrated in FIG. 4C. Forming mask 9 is similar as explained above with regard to FIG. 1O and includes forming a mask layer 9 on the second surface 102 and recessing the mask layer 9 so that the first p-type semiconductor region 3 is exposed while the two exemplary second p-type semiconductor regions 5 remain covered by mask 9.

Thereafter, the second surface 102 is locally treated with a hydrogen plasma through mask 9. As explained above with regard to FIGS. 1D to 3 and illustrated in FIG. 4D after removing mask 9, this results in locally reducing the effective n-type doping above the recessed portion of the second surface 102. Accordingly, two typically step-shaped second n-type semiconductor regions 2a having a higher doping concentration than the first n-type semiconductor layer 1 are formed.

Figure 4E:
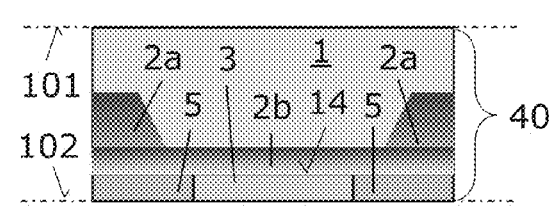

Thereafter, further protons are typically mask-less implanted from the second surface 102 into the semiconductor wafer 40 to form a field-stop layer 2a, 2b which is contiguous also in the vertical cross-section. The implanted further protons typically have a lower maximum energy and penetration depth, respectively, compared to the protons implanted prior to locally treating the second surface 102 with masked hydrogen plasma. The field-stop layer 2a, 2b includes two deep field-stop portions 2a and a second n-type portion 2b formed below the deep field-stop portions 2a, extending typically to the second surface 102 and forming a shallow field-stop layer 2b. The resulting semiconductor structure 200 is illustrated in FIG. 4E and may correspond to a diode, thyristor or an IGBT. In the latter case, the method typically includes forming at least one n-channel field-effect structure next to the first surface 101, for example prior to forming field-stop layer 2a, 2b.

Typically, the formed semiconductor device 200 is a vertical power semiconductor device with an active area having a plurality of unit cells and two load electrodes. The first of the two load electrodes is formed on the first surface 101 and the second load electrode is formed on the second surface 102 and in low resistive contact with the p-type semiconductor layer 3, 5, for example by deposition. For manufacturing a vertical diode, the first load electrode is formed in low resistive contact with the first n-type semiconductor layer 1.

In a further embodiment, at least one of the first p-type semiconductor region 3 and the second p-type semiconductor region 5 of the p-type semiconductor layer 3, 5 is formed after the field-stop layer 2a, 2b, for example by masked implantation of p-type dopants.

Due to the contiguous field-stop layer 2a, 2b having a locally reduced vertical extension in the active area, the softness of the formed semiconductor device 200 during switching-off and/or commutating is improved. Furthermore, if the short-circuit capability of semiconductor device 200 is limited by the appearance of a too high electrical field-strength near the surface 102 due to a high electron concentration there (this typically occurs, if the emitter region 3 has a lower doping concentration than the emitter region 5), the short-circuit capability is typically additionally improved due to the locally reduced vertical extension of the field-stop layer 2a, 2b above the first p-type semiconductor region 3.

The processes explained with regard to FIGS. 4A to 4E are also well suited for thin-wafer technology as the used masks may have a comparatively low vertical extension of, for example, 1 µm and as the additional temperature budgets used for forming the field-stop layer 2a, 2b are also comparatively low.

The methods explained above with regard to FIGS. 1A to 4E have the following processes in common: a semiconductor body, for example a semiconductor wafer or substrate, having a first n-type semiconductor layer with a first maximum doping concentration arranged below a first surface defining a vertical direction is provided, protons are implanted into the first n-type semiconductor layer, through a second surface arranged opposite to the first surface and preferably the second surface is treated with a hydrogen plasma.

After a subsequent annealing, a second n-type semiconductor layer having a maximum doping concentration which is higher than the first maximum doping concentration is formed in the first n-type semiconductor layer without high temperature loads. The vertical doping profile of the second n-type semiconductor layer may be adjusted by energies and number of proton implantations, annealing conditions and conditions of hydrogen plasma treatment.

Whereas the protons are typically mask-less implanted, typically through the second surface, the second surface is typically treated with the hydrogen plasma through a mask. Accordingly, the second n-type semiconductor layer may be structured in a horizontal direction and a horizontal plane, respectively. This allows manufacturing of vertical semiconductor devices with vertically and/or horizontally structures field-stop regions having, for example a lower penetration depth in the peripheral area compared to an active area for improving the switching behavior and/or optimizing the charge-carrier and current-density distribution during operation inside the device. As the mask may be comparatively thin, for example only 1 µm thick or even thinner, the processes are compatible with thin-wafer technology.

In the following, further examples of semiconductor devices that may be manufactured using the processes explained above with regard to FIGS. 1A to 4E are explained.

Figure 5A:
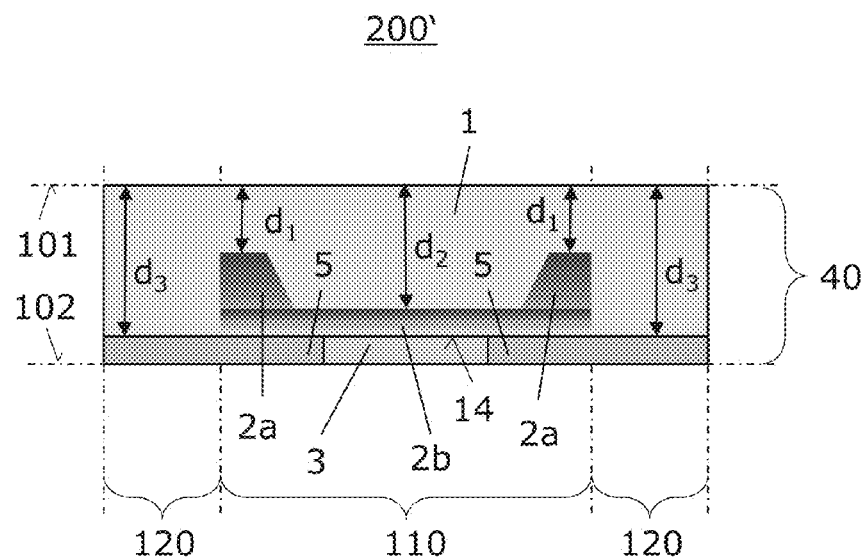
FIG. 5A illustrates a vertical cross-section through a bipolar semiconductor device according to an embodiment.

FIG. 5A illustrates a vertical cross-section through a bipolar semiconductor device 200' including a semiconductor body 40. The semiconductor body 40 includes a first surface 101 having a normal direction $e_n$ defining a vertical direction. A first n-type semiconductor region 1 is arranged below the first surface 101 and has a first maximum doping concentration. A second n-type semiconductor region 2a, 2b, typically forming a contiguous field-stop region 2a, 2b, is arranged below the first n-type semiconductor region 1. The second n-type semiconductor region 2a, 2b includes in an active area 110 two spaced apart first n-type portions 2a, which typically form deep field-stop portions, adjoin the first n-type semiconductor region 1, and have a first minimum distance $d_1$ to the first surface 101 and a maximum doping concentration which is higher than the first maximum doping concentration. The second n-type semiconductor region 2a, 2b further includes in active area 110 a second n-type portion 2b, which typically forms a shallow field-stop layer, adjoins the first n-type semiconductor region 1, and has a maximum doping concentration which is higher than the first maximum doping concentration. In active area 110, a second minimum distance $d_2$ between the second n-type portion 2b and the first surface 101 is larger than the first minimum distance $d_1$. The second n-type semiconductor region 2a, 2b typically forms, in the shown vertical cross-section, a U-shaped field-stop region having a lower vertical extension in a central portion. A p-type second semiconductor layer 3, 5 is arranged below and forms a pn-junction 14 with the second n-type portion 2b.

Semiconductor device 200' may, for example, be operated as a diode, a thyristor or an IGBT. For sake of clarity, further pn-junction, load electrodes and gate electrodes of semiconductor device 200' are not illustrated in FIG. 5A.

Typically, semiconductor device 200' is a power semiconductor device having a plurality of unit cells 110 which are surrounded by a peripheral area 120 and a contiguous structured field-stop region with one U-shaped portion in each unit cell 110.

The p-type second semiconductor layer 3, 5 typically includes, in a vertical cross-section and per unit cell, a first p-type semiconductor region 3 having a second maximum doping concentration, and two second p-type semiconductor regions 5 each having a maximum doping concentration which is higher than the second maximum doping concentration so that the first p-type semiconductor region 3 extends between the two second p-type semiconductor regions 5.

Furthermore, the first p-type semiconductor region 3 is typically arranged between the two first n-type portions 2a when seen from above. The first p-type semiconductor region 3 and/or the second n-type portion 2b may be shaped as a circle, an ellipse, a strip, a square, a rectangle, or any other polygon when seen from above. The two first n-type portions 2a may substantially be formed as two bars or may form one ring or an ellipse, a square, a rectangle, or any other polygon when seen from above.

In the exemplary embodiment, the second n-type portion 2b is only formed in active area 110. Device simulations show that the softness during switching-off and/or commutating is very good, even if the structured field-stop region 2a, 2b does not extend into the peripheral area. The breakdown voltage of semiconductor device 200' is typically increased compared to semiconductor devices with field-stop layers extending into the peripheral area, as the vertical extension $d_3$ of the first n-type semiconductor region 1 is increased in the peripheral area 120.

According to an embodiment, the maximum doping concentration of the second p-type semiconductor region 5 includes a first portion which is arranged in the peripheral area 120 and a second portion which is arranged in the active area 110 and has a maximum doping concentration which is higher than a maximum doping concentration of the first portion. Typically, the maximum doping concentration of the second portion is lower than the maximum doping concentration of the second n-type portion 2b. This may result in an increased blocking capability of the peripheral area 120 compared to the active area 110. Accordingly, the device behavior in an Avalanche mode may be improved since Avalanche breakdowns will occur in active area 110 of semiconductor device 200'. This may also be achieved by a second p-type semiconductor region 5 which is only arranged in the active are 120. Typically, the maximum doping concentration of the second p-type semiconductor region 5 is comparatively low in embodiments in which the second n-type portion 2b does not extend into the peripheral area 120 to avoid a punch through.

In other embodiments, the second n-type portion 2b extends into the peripheral area 120. In these embodiments, the distance between the first surface 101 and the second n-type portion 2b in the peripheral area 120 may be larger than the second minimum distance $d_2$.

Note that the peripheral area 120 may include one or more edge-termination structures such as field plates, floating guard rings VLD structures (variation of lateral doping) or the like. For sake of clarity, additional edge-termination structures are not shown in In FIG. 5A.

Semiconductor device 200' may be manufactured similar as explained above with regard to FIGS. 4A to 4E with a mask that does not cover the peripheral area 120 during locally treating the second surface 102 with hydrogen plasma. In embodiments in which the second n-type portion 2b is only arranged in active area 110, a second process of locally treating the second surface 102 with hydrogen plasma through a second mask covering only the active area 110 is typically used. Alternatively, the field-stop layer 2b may be produced by a masked implantation.

Figure 5B:
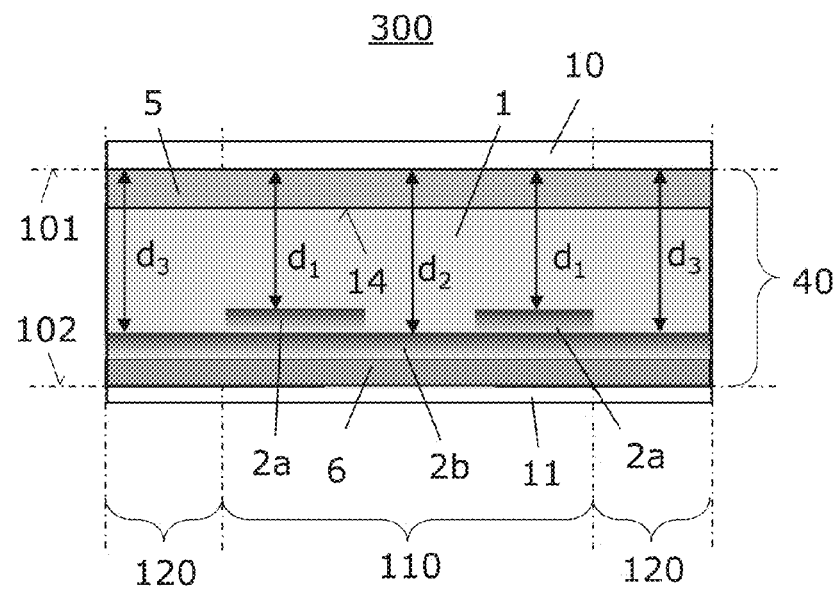
FIG. 5B illustrates a vertical cross-section through a bipolar semiconductor device according to another embodiment.

FIG. 5B illustrates a vertical cross-section through a bipolar semiconductor device 300. Semiconductor device 300 is a vertical diode, typically a power diode, with an anode metallization 10 arranged on the first surface 101, a cathode metallization 11 arranged on the second surface 102 and a structured field-stop region 2a, 2b arranged close to a highly n-doped emitter region 6. The structured field-stop region 2a, 2b typically includes in an active area 110 and per unit cell two spaced apart first n-type portions 2a which adjoin a first n-type semiconductor region 1, have a first minimum distance $d_1$ to the first surface 101 and a maximum doping concentration which is higher than a first maximum doping concentration of the first n-type semiconductor region 1, and a second n-type portion 2b which adjoins the first n-type semiconductor region 1 and has a maximum doping concentration which is higher than the first maximum doping concentration. In active area 110, a second minimum distance $d_2$ between the second n-type portion 2b and the first surface 101 is larger than the first minimum distance $d_1$. In the exemplary embodiment, the second n-type portion 2b extends at least partially into the peripheral area 120. The minimum distance $d_3$ of the second n-type portion 2b in the peripheral area 120 may be larger than the first minimum distance $d_1$ and also larger than the distance $d_2$.

Due to the structured field-stop region 2a, 2b, semiconductor device 300 typically has good softness and high breakdown voltage.

According to an embodiment, the two first n-type portions 2a of the structured field-stop region 2a, 2b illustrated vertical cross-section are replaced by one contiguous n-type portions 2 in active area 110 which is, for example, substantially U-shaped having a lower vertical extension in a central portion and optionally having a lower vertical extension in the region of the junction termination.

Semiconductor device 300 may be manufactured similar as explained above with regard to FIGS. 1A to 3 and FIGS. 4A to 4E, respectively, for example by providing a semiconductor body with a vertically extending pn-junction 14 as a first process step of the method as explained above with regard to FIGS. 1A to 3. Alternatively, the pn-junction 14 may be formed after forming the structured field-stop layer 2a, 2b, for example by implantation p-type dopants at the first surface 102. The highly n-type doped emitter 6 may be formed together with or after forming the structured field-stop layer 2a, 2b, for example by implanting n-type dopants at the second surface 102 with a subsequent laser thermal annealing.

According to an embodiment, the active area 110 includes a plurality of unit cells each having a structured field-stop region 2a, 2b and first and second p-type semiconductor regions 3, 5 or n-type layers 6 as illustrated in FIGS. 1D, 4E and 5A, 5B. The doping concentrations of the structured field-stop regions 2a, 2b of the unit cells may be substantially equal. In other embodiments, first unit cells and second unit cells, which have a structured field-stop region 2a, 2b with a higher maximum doping concentration than the first unit cells, form a regular array in the active area 110. For example, the first and second unit cells may form an alternating lattice. In a further embodiment, unit cells having a structured field-stop region 2a, 2 are spaced apart by areas without a structured field-stop region.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a laterally varying n-type doping concentration, comprising:
providing a semiconductor wafer comprising a first surface, a second surface arranged opposite to the first surface, and a first n-type semiconductor layer having a first maximum doping concentration;
forming in the first n-type semiconductor layer a second n-type semiconductor layer having a maximum doping concentration which is higher than the first maximum doping concentration, wherein forming the second n-type semiconductor layer comprises implanting protons of a first maximum energy into the first n-type semiconductor layer; and
locally treating the second surface with a masked hydrogen plasma.

2. The method of claim 1, wherein forming the second n-type semiconductor layer further comprises annealing after implanting the protons.

3. The method of claim 1, wherein the protons are implanted through the second surface into the first n-type semiconductor layer.

4. The method of claim 1, wherein the protons are maskless implanted into the first n-type semiconductor layer.

5. The method of claim 1, wherein the first maximum energy is at least about 500 keV.

6. The method of claim 1, further comprising, prior to masked hydrogen plasma treating, at least one process of implanting protons of a maximum energy which differs from the first maximum energy through the second surface.

7. The method of claim 1, further comprising, after masked hydrogen plasma treating, implanting protons of a maximum energy which differs from the first maximum energy through the second surface.

8. The method of claim 1, wherein locally treating the second surface comprises at least one of:
forming a mask layer on the second surface;
recessing the mask layer in a peripheral area; and
recessing the mask layer in an active area.

9. The method of claim 1, wherein the semiconductor wafer is provided with an extension in a normal direction of the first surface of less than about 200 μm.

10. The method of claim 1, further comprising forming a first p-type semiconductor region which comprises a second maximum doping concentration and extends to one of the first surface and the second surface.

11. The method of claim 1, wherein locally treating the second surface with the masked hydrogen plasma is performed for at least 15 min.

12. The method of claim 1, wherein locally treating the second surface with the masked hydrogen plasma is performed at a plasma temperature of about 300° C. to about 600° C.

13. The method of claim 8, wherein an extension of the mask layer in a normal direction of the first surface is less than about 1 μm.

14. The method of claim 10, wherein first p-type semiconductor region extends to the second surface, the method further comprising forming, in a vertical cross-section which is substantially orthogonal to the first surface, two second p-type semiconductor regions each of which extends to the second surface and comprises a maximum doping concentration which is higher than the second maximum doping concentration, such that the first p-type semiconductor region extends, in the vertical cross-section, between the two second p-type semiconductor regions.

15. The method of claim 10, wherein locally treating the second surface comprises at least one of:
forming a mask layer on the second surface; and
recessing the mask layer so that the first p-type semiconductor region is exposed.

16. A method for forming a bipolar semiconductor device, comprising:
providing a semiconductor wafer comprising a first surface having a normal direction defining a vertical direction, and a first n-type semiconductor layer arranged below the first surface;

forming a p-type semiconductor layer that forms a pn-junction with the first n-type semiconductor layer;
implanting protons into the first n-type semiconductor layer; and
locally treating a second surface of the semiconductor wafer with a masked hydrogen plasma.

17. The method of claim 16, wherein the bipolar semiconductor device is formed such that the p-type semiconductor layer extends to the second surface and comprises, in a vertical cross-section, a first p-type semiconductor region having a second maximum doping concentration and two second p-type semiconductor regions each having a maximum doping concentration which is higher than the second maximum doping concentration, and that the first p-type semiconductor region is, in the vertical cross-section, arranged between the two second p-type semiconductor regions, and wherein locally treating the second surface comprises at least one of:
  forming a mask layer on the second surface; and
  recessing the mask layer so that the first p-type semiconductor region is exposed.

18. The method of claim 16, wherein implanting protons into the first n-type semiconductor layer comprises implanting protons of a first energy into the first n-type semiconductor layer, the method further comprising, after masked hydrogen plasma treating, implanting further protons having an energy which is lower than the first energy from the second surface into the semiconductor wafer.

19. The method of claim 16, further comprising at least one of:
  masked implanting of dopants through the second surface to form p-type regions of different maximum doping concentration in the p-type semiconductor layer after locally treating the second surface with the masked hydrogen plasma;
  annealing after implanting protons into the first n-type semiconductor layer;
  implanting further protons after locally treating the second surface; and
  forming an n-channel field-effect structure next to the first surface.

* * * * *